United States Patent
Jones, Jr. et al.

(10) Patent No.: US 9,246,475 B2
(45) Date of Patent: Jan. 26, 2016

(54) DUAL-COMPLEMENTARY INTEGRATING DUTY CYCLE DETECTOR WITH DEAD BAND NOISE REJECTION

(71) Applicant: United Memories, Inc., Colorado Springs, CO (US)

(72) Inventors: Oscar Frederick Jones, Jr., Colorado Springs, CO (US); Jon Allan Faue, Colorado Springs, CO (US)

(73) Assignee: United Memories, Inc., Colorado Springs, CO (US)

( * ) Notice: Subject to any disclaimer, the term of this patent is extended or adjusted under 35 U.S.C. 154(b) by 14 days.

(21) Appl. No.: 14/249,088

(22) Filed: Apr. 9, 2014

(65) Prior Publication Data

US 2015/0295564 A1    Oct. 15, 2015

(51) Int. Cl.
*H03K 5/156* (2006.01)
*H03K 3/017* (2006.01)

(52) U.S. Cl.
CPC ............... *H03K 3/017* (2013.01); *H03K 5/156* (2013.01)

(58) Field of Classification Search
CPC ............ G11C 7/04; G11C 8/18; G11C 29/02; G11C 15/04; H03M 3/39; H03M 13/1515; H03M 3/34; H03K 5/24; H03K 19/00; H03K 5/125; H03K 5/156; H03K 5/26

USPC .................................. 327/172, 173, 174, 175
See application file for complete search history.

(56) References Cited

U.S. PATENT DOCUMENTS

| | | | |
|---|---|---|---|
| 3,864,583 A * | 2/1975 | Fiorino | ........................... 327/93 |
| 4,475,086 A | 10/1984 | Allen | |
| 6,643,790 B1 | 11/2003 | Yu et al. | |
| 7,015,739 B2 | 3/2006 | Lee et al. | |
| 7,570,094 B2 | 8/2009 | Mnich | |

\* cited by examiner

*Primary Examiner* — John Poos
(74) *Attorney, Agent, or Firm* — Peter J. Meza; Hogan Lovells US LLP

(57) ABSTRACT

A method for correcting the duty cycle of a clock signal uses two-dual-slope integrators with two comparators; each comparator is connected to both integrators and configured to include a "dead band" when the input pulse duty cycle is at or near 50%. One comparator detects when duty cycle is high and the other comparator detects when the duty cycle is low. When the duty cycle is within the "dead band" range, neither comparator goes valid. This provides an analog filter where the output comparators will not instantaneously switch between opposite duty cycle correction states. When the duty cycle is greater or less than 50%, the integrated voltages on the two integrators move in opposite directions producing twice the signal magnitude on differential inputs of the comparators, as compared with using a single integrator architecture.

24 Claims, 11 Drawing Sheets

To Fig. 1B

DUAL-COMPLEMENTARY INTEGRATING DUTY CYCLE DETECTOR WITH DEAD BAND NOISE REJECTION

BACKGROUND OF THE INVENTION

The present invention relates to a circuit and method for correcting the duty cycle of a clock signal, the circuit and method including a dead band when the duty cycle of the clock signal is at or close to a 50% duty cycle.

Duty Cycle Correction (DCC) solutions typically use a dual-slope integrator where one phase of the clock charges the integrator positive and the other phase of the clock discharges the integrator. When one dual-slope integrator is used, a comparator compares the integrated voltage to a reference voltage, and mid-point referencing is usually used. With this approach, the comparator outputs a logical "1" or "0" to indicate if the integrated voltage is above or below the reference voltage; a logical "1" or "0" identifies if the duty cycle is above or below the 50%. Adjusting duty cycle using a two-state detector typically results with "dithering" around the desired solution point.

In some cases, two dual-slope integrators have been used (See U.S. Pat. No. 7,570,094 B2). The two integrators are isolated where one integrator directly adjusts the bias on a delay stage to control pull-down slew rate and the other integrator controls the delay stage pull-up slew rate. This is an analog method that directly uses the integrated voltages to bias the delay stage. This method constantly adjusts the bias voltages to acquire a 50% duty cycle from the delay stage(s). In many applications, it is undesirable to constantly chase a clock that jitters or has other small instantaneous variations with the clock duty cycle. This approach does not use a digital solution to correct duty cycle distortion, but generates two analog voltages that are directly applied to the delay stage block to constantly adjust for a 50% output duty cycle.

What is desired, therefore, is an improved duty cycle detector circuit that eliminates the undesirable dithering about the 50% duty cycle operating condition.

SUMMARY OF THE INVENTION

According to an embodiment of the present invention, a circuit and method for correcting the duty cycle of a clock signal uses two dual-slope integrators with two comparators; each comparator is connected to both integrators and is configured to include a "dead band" when the input pulse duty cycle is at or near 50%. One comparator detects when duty cycle is high and the other comparator detects when the duty cycle is low. When the duty cycle is within the "dead band" range, neither comparator goes valid. This provides an analog filter where the output comparators will not instantaneously switch between opposite duty cycle correction states. When the duty cycle is greater or less than 50%, the integrated voltages on the two integrators move in opposite directions producing twice the signal magnitude on differential inputs of the comparators, as compared with using a single integrator architecture. An additional advantage of the interconnected comparators and integrators is that the ratio of the resistors used for the dual-slope integrators can be equally adjusted based on the ideal common mode trip point of the comparators. The operation and the "dead band" are maintained over a relatively large pull-up/pull-down resistor ratio. An additional feature of this invention is the inclusion of "offset" programming of the individual integrator resistor ratios. This programming provides a method to offset the integration voltage on one integrator differently than the other which can be used to reduce or increase the "dead band" range or compensate for device characteristic variances. Additionally, both integrators can be programmed in the same direction to adjust for the ideal common-mode voltage of the comparators. A reset circuit is included to preset the integrators to near the 50% bias point (near or within the "dead band") to accelerate the time for initial solution of the Duty Cycle Corrector.

DETAILED DESCRIPTION

Figure 1A:
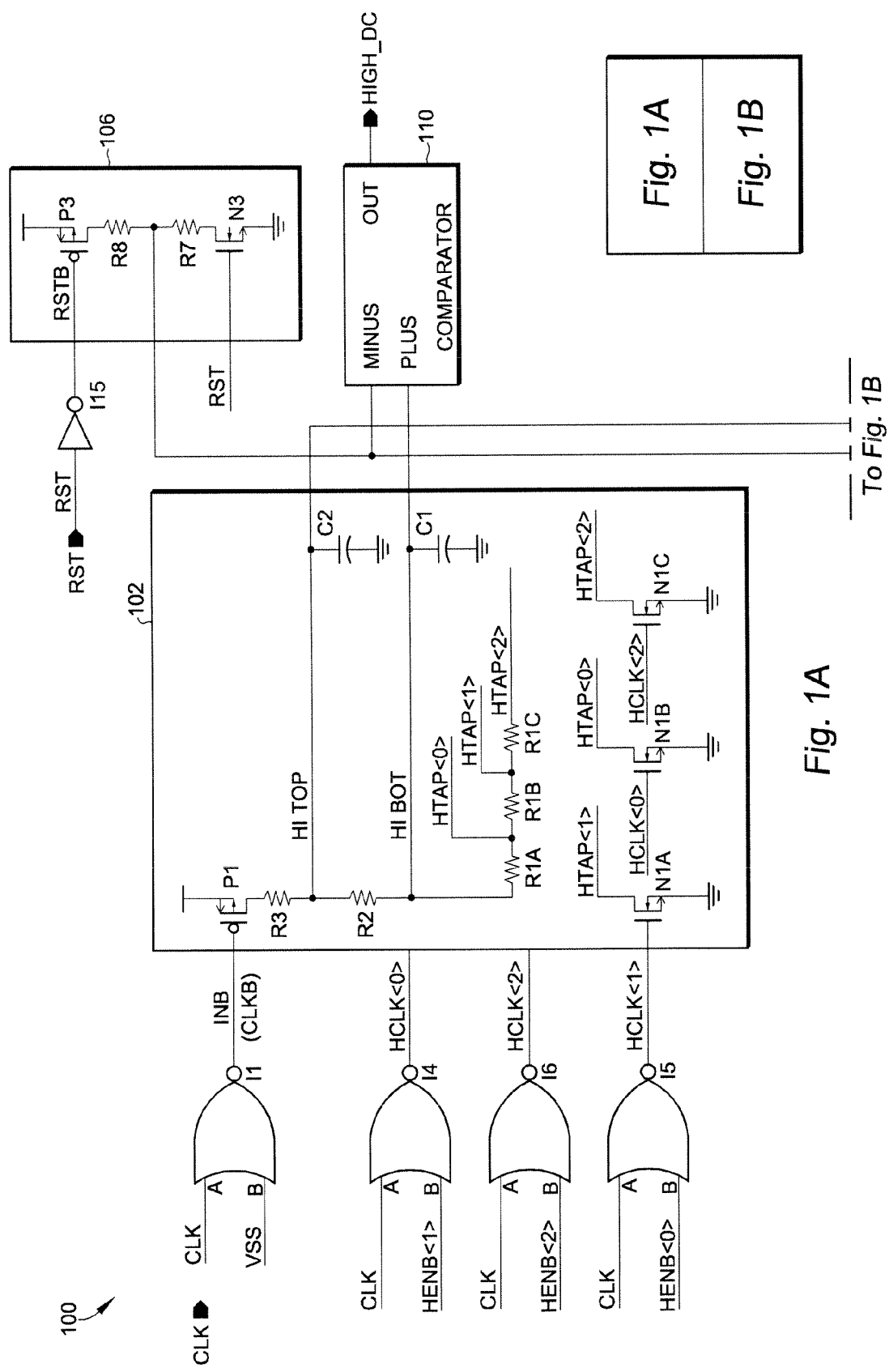
FIGS. 1A and 1B are a schematic diagram of a duty cycle detector according to an embodiment of the present invention.
Figure 1B:
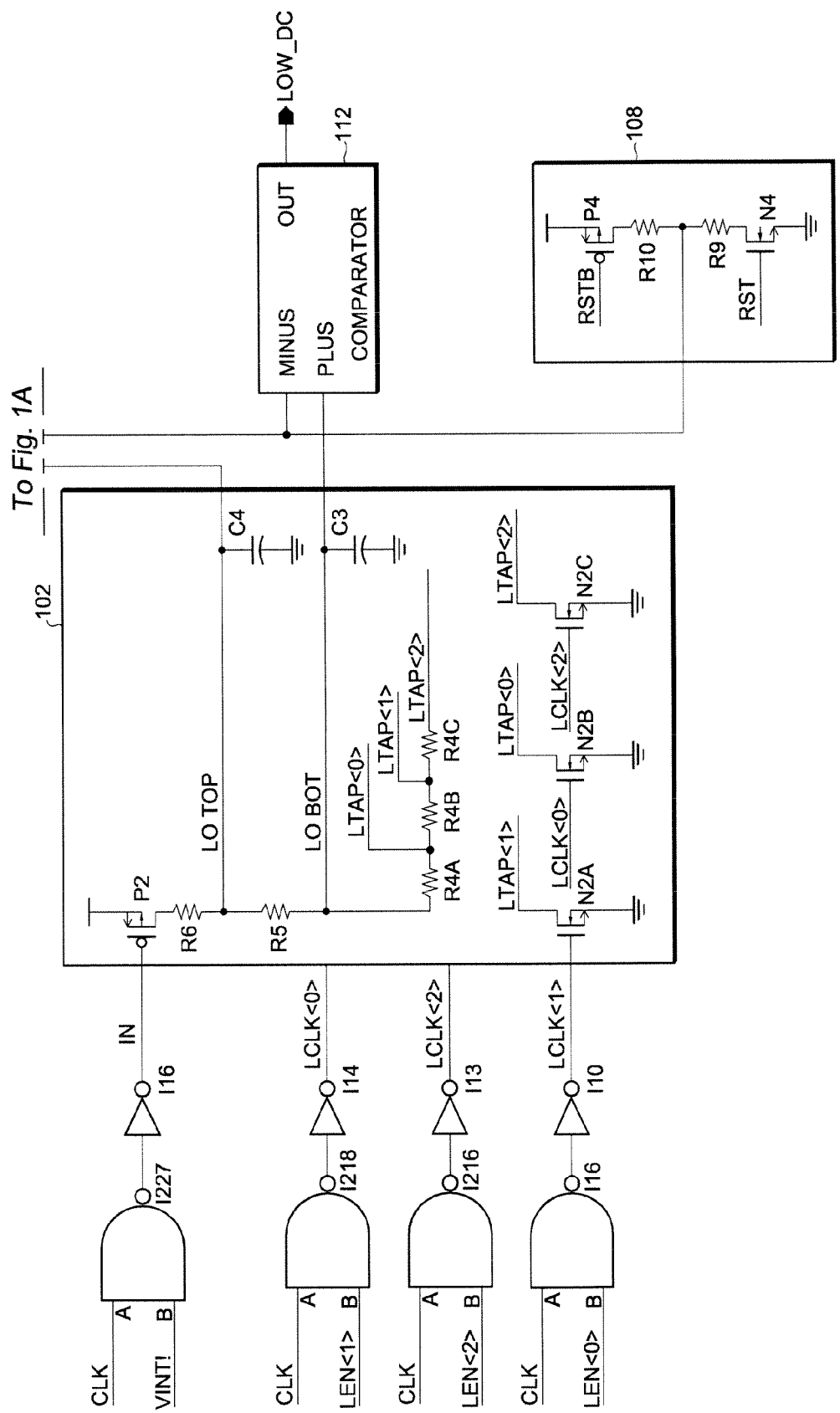

The invention uses two integrators 102 and 104 as shown in FIGS. 1A and 1B. The top integrator 102 (N1, R1, R2, R3, P1, C1 and C2) uses CLKB (Low True Clock) and the bottom integrator 104 (N2, R4, R5, R6, P2, C3, C4) uses CLK (High True Clock). Each integrator has a resistor stack where the resistor values of resistors in the top integrator 102 (R1, R2, and R3) are equal to the values of the respective resistors in the bottom integrator (R4, R5, and R6). Typically R1=R3 and R4=R6, but this is not a limitation and other values can be used. For example, R1<R3 and R4<R6 which results with the voltage levels into the comparators 106 and 108 being shifted down (lowering the common mode trip point) and when R1>R3 and R4>R6, the input levels to the comparators 106 and 108 are shifted up. Resistors R2 and R5 determine the "dead band" range (R2<<R3 and R2<<R1).

A reset circuit including reset circuit portion 108 (N4, P4, R9 and R10 are resetting HI_TOP) and reset circuit portion 106 (N3, P3, R7 and R8 for resetting LO_TOP), is included to initialize the voltages of the integrators on HI_TOP and LO_TOP to values near the "dead band" determined by the values of integrator resistor stack. Although not directly connected to the reset circuit, the voltages on HI_BOT and LO_BOT are also preset by the reset circuit through resistors R2 and R5. The exact voltage during reset signal activation is not critical; the purpose of reset is to decrease the time to reach the integrated voltage level on each of the signals connected to the inputs of the comparators. The voltages applied to the comparator inputs are determined by the alternately enabled transistors N1 and P1 in the top integrator and N2 and P2 in the bottom integrator. The reset circuit can be eliminated when solution speed is not an issue.

The top integrator 102 uses the inverted clock phase, CLKB, to alternately enable transistors P1 and N1. When CLKB is low, P1 sources current to charge the integrating capacitors through R3 (and R2) raising the voltage on capacitors C2 and C1. When CLKB is high, N1 sinks current to ground, discharging capacitors C2 and C1 through R1 (and R2) lowering the voltage on capacitors C2 and C1. In this way, the integrated voltages, HI_TOP and H_BOT will increase with increasing CLK duty cycles (increasing CLK high time relative to CLK low time) and HI_TOP and H_BOT will decrease with decreasing CLK duty cycles (decreasing CLK high time relative to CLK low time). Similarly, the bottom integrator 104 works in an identical manner, except the true clock phase is used, CLK, instead of CLKB. When CLK has a 50% duty cycle, the voltage on H-TOP will be the same as the voltage on L-TOP (voltage on HI_BOT will also be the same as the voltage on LO_BOT). So, the 50% CLK condition results in both comparator outputs going low since HI_BOT and LO_BOT are at lower voltage potentials than LO_TOP and HI_TOP respectively. When the duty cycle is greater than 50%, the integrated voltages on HI_TOP and HI_BOT increase, while the voltages on LO_TOP and LO_BOT decrease. When the duty cycle is sufficiently greater than 50% to cause the voltage on HI_BOT to be greater than the voltage on LO_TOP, the HIGH-DC comparator will switch to a "1", indicating that the duty cycle was greater than 50%. Conversely, when the duty cycle is sufficiently less than 50%, then the output of the LOW-DC comparator will go high indicating that the duty cycle is less than 50%.

The Outputs HIGH-DC and LOW-DC provide control signals to duty cycle correcting circuits; HIGH-DC high indicates that the CLOCK duty cycle is too high and the duty cycle correcting circuit needs to reduce the duty cycle (decrease CLOCK high time), LOW-DC high indicates that the CLOCK duty cycle is too low and the duty cycle correcting circuit needs to increase the duty cycle (increase CLOCK high time). Neither HIGH-DC high or LOW-DC high (both low) indicates that no duty cycle correction is needed.

When a high duty cycle exists and HI_BOT goes sufficiently higher than LO_TOP, the HIGH-AMP will switch from a "0" to a "1" indicating that a greater than 50% duty cycle occurred. Likewise, when a low duty cycle exists and LO_BOT goes sufficiently higher than HI_TOP, the LOW-AMP will switch from a "0" to a "1" indicating that a less than 50% duty cycle occurred. The differential voltage between HI_BOT and LO_TOP and between LO_BOT and HI_TOP determines the output state of the comparators. The relative offset between the "BOT" nodes and the "TOP" nodes can be programmed by selecting the tap point on R1 or R4, (R1<<R2, R4<<R5, R1 may be different than R4). If R1 or R4 is programmed to a higher resistance value, then the associated TOP and BOT node voltages will increase and programming R1 or R4 to a lower resistance value will decrease the associated TOP and BOT node voltages will decrease. The "HI" integrator and the "LO" integrator are independently programmable that can be used to increase or decrease the "dead band" using R1 or R4 programming. R1 programming is done by selecting the appropriate NOR gate path, I4 through I6, connected to transistors N1A or N1B or N1C. R4 programming is done be selecting the appropriate NAND/Inverter gate path, I7 through I12, connected to transistors N2A or N2B.

Resistor R1 is thus divided into resistor components R1A, R1B, and R1C, with corresponding tap points HTAP<0>, HTAP<1>, and HTAP<2>. Transistors N1A, N1B, and N1C receive the gated HCLK<0>, HCLK<1>, and HCLK<2> signals and are in turn coupled to the resistor R1 tap points. Similarly, resistor R4 is thus divided into resistor components R4A, R4B, and R4C, with corresponding tap points LTAP<0>, LTAP<1>, and LTAP<2>. Transistors N4A, N4B, and N4C receive the gated LCLK<0>, LCLK<1>, and LCLK<2> signals and are in turn coupled to the resistor R4 tap points.

Figure 3:
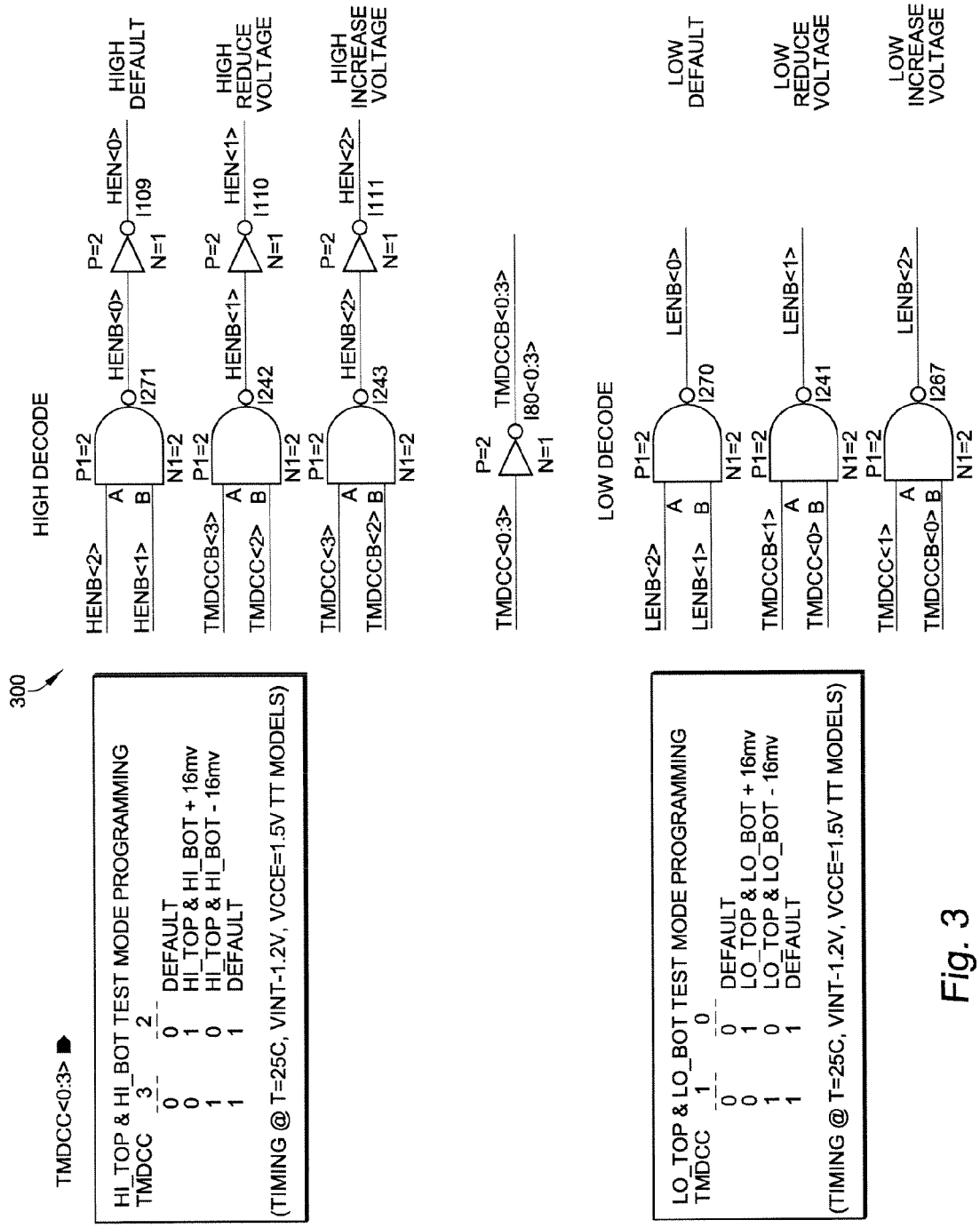
FIG. 3 is a schematic diagram of digital decoding circuit that can be used in conjunction with the duty cycle detector of FIGS. 1A and 1B.

Programming selection signals, HENB<0:2> and LEN<0:2> are generated in a DCC-PGM logic block shown in FIG. 3. NOR gates I4, I6, and I5 receive the CLK signal as well as the HENB<0:2> signals and generate the HCLK<0:2> signals. NAND gates I218, I216, and I11 receive the CLK signal as well as the LEN<0:2> signals and are coupled to inventers I14, I13, and I10, which in turn generate the LCLK<0:2> signals. NOR gate I1 receives the CLK and VSS signals and generates the INB signal at the gate of transistor P1. NAND gate I227 receives the CLK and VINT signals and is coupled to inverter I16, which generates the IN signal at the gate of transistor P2. For NOR gate I1, in FIGS. 1A and 1B, VSS is used as a logic zero so that the INB path is identical to the HCLK<0:2> paths. In a similar fashion, VINT or a logic one is used as an input to NAND gate I227, so that identical NAND gates drive IN and LCLK<0:1>. The gate matching should not be an absolute requirement, but is the preferred method so that the delays match. It should also be noted in FIGS. 1A and 1B that inverter I15 is used to receive the reset RST signal and to generate an inverted RSTB signal required for the proper operation of reset signal portions 106 and 108.

Figure 2:
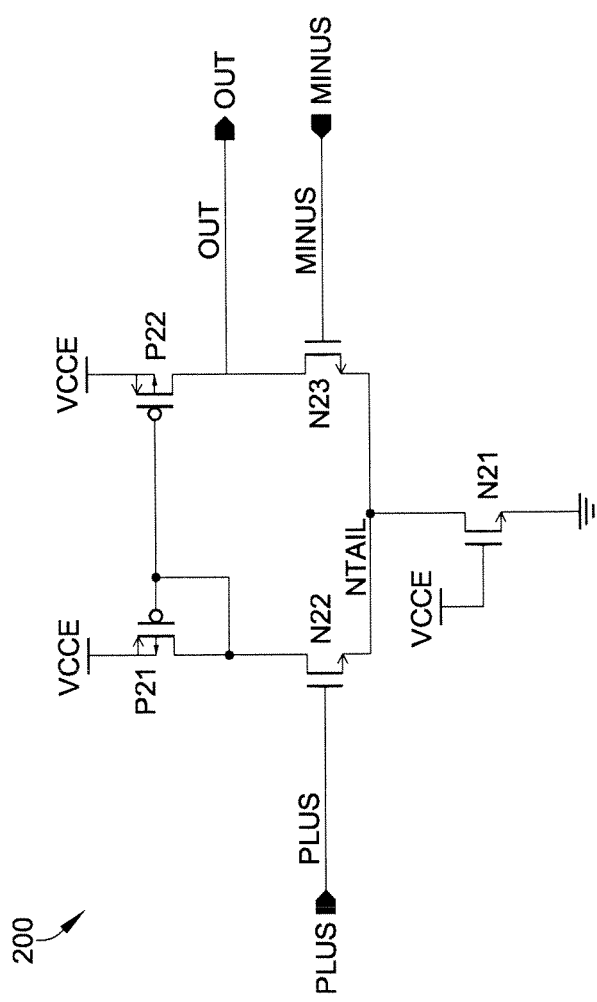
FIG. 2 is a schematic diagram of a comparator that is used in the duty cycle detector of FIGS. 1A and 1B.

Referring now to FIG. 2, a comparator 200 suitable for use in the duty cycle detector circuit of FIGS. 1A and 1B is shown. Comparator 200 includes an active load including P-channel transistors P21 and P22 coupled to VCC (VCCE), a differential pair including N-channel transistors N22 and N23, and tail current transistor N21 coupled to VSS or ground. The gate of transistor N21 is coupled to VCC (VCCE). The gate of transistor defines the PLUS input nodes, the gate of transistor N23 defines the MINUS input node, and the drain of transistor N23 defines the OUT output node. The sources of transistors N22 and N23, and the drain of transistor N21 are coupled together to define the NTAIL node. The simple comparator of FIG. 2 is used to save integrated circuit die area, but other comparators can be used as is known in the art.

Referring again to FIG. 2, VCC (VCCE) is shown to be the supply voltage for the differential P-Channel transistors of the comparator/differential amplifier 200 and the signal connected to the gate of transistor N21 for biasing the amplifier 200. The VCCE voltage (External Supply) is different from the VINT voltage (internal regulated supply). In an embodiment of the invention, the higher voltage (VCCE) was used for the comparator 200 to increase signal margin for the amplifiers. Programmable logic, logic driving the integrators, the integrators, and the reset circuits are powered by VINT (regulated voltage) and the amplifiers/comparators powered by VCCE. While an embodiment of the present invention is shown in FIGS. 1A-3 using two power supplies, two separate power supplies are not a requirement and a single power supply can be used.

As mentioned above, programming selection signals, HENB<0:2> and LEN<0:2> are generated in a DCC-PGM logic block 300 as is shown in FIG. 3. TMDCC mnemonic indicates Test Mode Duty Cycle Correction signals. TMDCC<0:3> and generated TMDCCB<0:3> signals provide a method to adjust the integration offsets. These signals can be used for test purposes or to selectively adjust the integration offsets for normal operation. The default values for TMDCC<0:3> are all zero. It should be mentioned that programmability, via HENB and LEN signals are not needed if programmability of the integrator is not required. In this case, only one pull-down N-channel transistor per integrator would be required and the taps at the bottom of the integrators would be replaced with a single resistor per integrator. Inverter 180 receives the TMDCC<0:3> signal and generates the TMDCCB<0:3> signal. Inverter 180 has four separate inverters, one for each of the four outputs TMDCCB<0:3>. In the LOW DECODE section of logic block 300, NAND gate I270 receives the LENB<2> and LENB<1> signals to generate the LENB<0> signal for a LOW DEFAULT setting. NAND gate I241 receives the TMDCCB<1> and TMDCC<0> signals to generate the LENB<1> signal for a LOW REDUCE VOLTAGE setting. NAND gate I267 receives the TMDCC<1> and TMDCCB<0> signals to generate the LENB<2> signal in a LOW INCREASE VOLTAGE setting. In the HIGH DECODE section of logic block 300, NAND gate 1271 receives the HENB<2> and HENB<1> signals to generate the HENB<0> signal and the HEN<0> signal through inverter I109 for a HIGH DEFAULT setting. NAND gate I242 receives the TMDCCB<3> and TMDCC<2> signals to generate the HENB<1> signal and the HEN<1> signal through inverter I110 for a HIGH REDUCE VOLTAGE setting. NAND gate I243 receives the TMDCC<3> and TMDCCB<2> signals to generate the HENB<2> signal and the HEN<2> signal through inverter 1111 in a HIGH INCREASE VOLTAGE setting. HENB<0>=0 and LEN<0>=1 are default cases, with TMDCC<0:3>=0. HENB<0:2> programs the CLK-high integrator, 102, and LEN<0:2> programs the CLK-low integrator, 104. When the default cases are selected, HENB<0>=0 and LEN<0>=1, HCLK<1> and LCLK<1> both go high enabling HTAP<1> and LTAP<1>, which are the mid-tap points on resistors R1<a,b,c> and R4<a,b,c> respectively. Programming HENB<1>=0 reduces HI_TOP and HI_BOT voltages relative to the default voltages by selecting HTAP<2>. The CLK-low integrator, 104, is programmed in a similar way, except LEN<0:2>, high true signals, selects integrated voltage levels on LOW_TOP and LOW_BOT nodes. It should be mentioned that the purposed of the TMDCC programming is to adjust for mismatches that can exist when the circuit is implemented in silicon; TMDCC is primarily used to compensate for circuit imbalances.

Various signal and node names are used in this specification. The following table shows the signal name used in the duty cycle detector versus the same signal name used on the waveforms in a DLL circuit used in FIGS. 4-10.

TABLE 1

| Duty Cycle Detector | DLL Circuit |
|---|---|
| CLK | RCLK |
| HIGH_DC | FSTF, FSTFL |
| LOW_DC | SLWF, SLWFL |
| RST | RSTDLL, DLLRST |
| N/A | SYNC (DLL Locked Signal) |
| N/A | DCCOK (CLOCK OK, Clock Running) |
| N/A | SYNC (DLL Locked Clock with DC Correction) |

The function of the reset circuits 106 and 108 discussed above with respect to FIGS. 1A and 1B is described in further detail below. The reset circuits are used to establish a near mid voltage on the HI_TOP and HI_BOT nodes. If no other influences existed, HI_BOT would be equal or lower to HI_TOP and LO_BOT would be equal or lower to HI_BOT. With a very small differential voltage difference on the comparators, the comparators could switch to either state, during or immediately after reset. However, in the present invention, the reset circuit is not the only mechanism that presets the integration nodes. In addition to the reset circuit, the transistors driving the integrators are connected during reset and impact the integrator node voltages. If the clock started out low for an extended period while in reset, for example, the voltage on HI_TOP would tend to go lower than the voltage on LO_BOT which would result in LOW_DC going active during reset. If the clock had been high during reset, the opposite comparator would have gone active. With the clock running, the voltages on the integrator can still be impacted away from the ideal reset voltage. Any of these conditions can cause the reset voltages on the integrator to deviate from the ideal reset voltage resulting in either a HIGH_DC or LOW_DC state; during or immediately after reset, one or the other comparator could go to a logic "1" until adequate time has occurred for a stable integrated solution. The intent of the reset circuit is to speed up the integrating process. Without reset, these nodes would have to integrate from the supply voltage or from ground toward the dead-band voltage zone which would increase the time to a stable solution. So, even though there can be an invalid solution during reset or immediately after reset, the time to a stable solution is significantly decreased by the addition of the reset circuit. There are solutions to eliminate the non-dead-band condition that may occur during reset, but more circuit complexity to eliminate this condition is probably not warranted.

Figure 4:
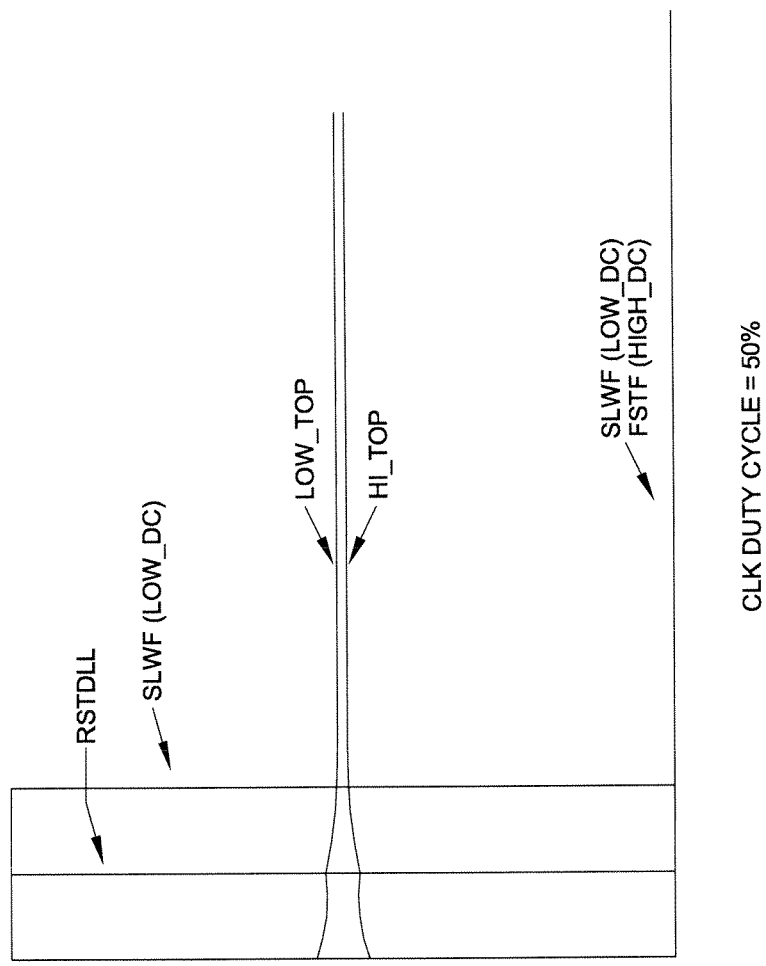
FIGS. 4-5 are waveform diagrams associated with the duty cycle detector circuit of FIGS. 1A and 1B having an input clock signal with a 50% duty cycle.
Figure 5:
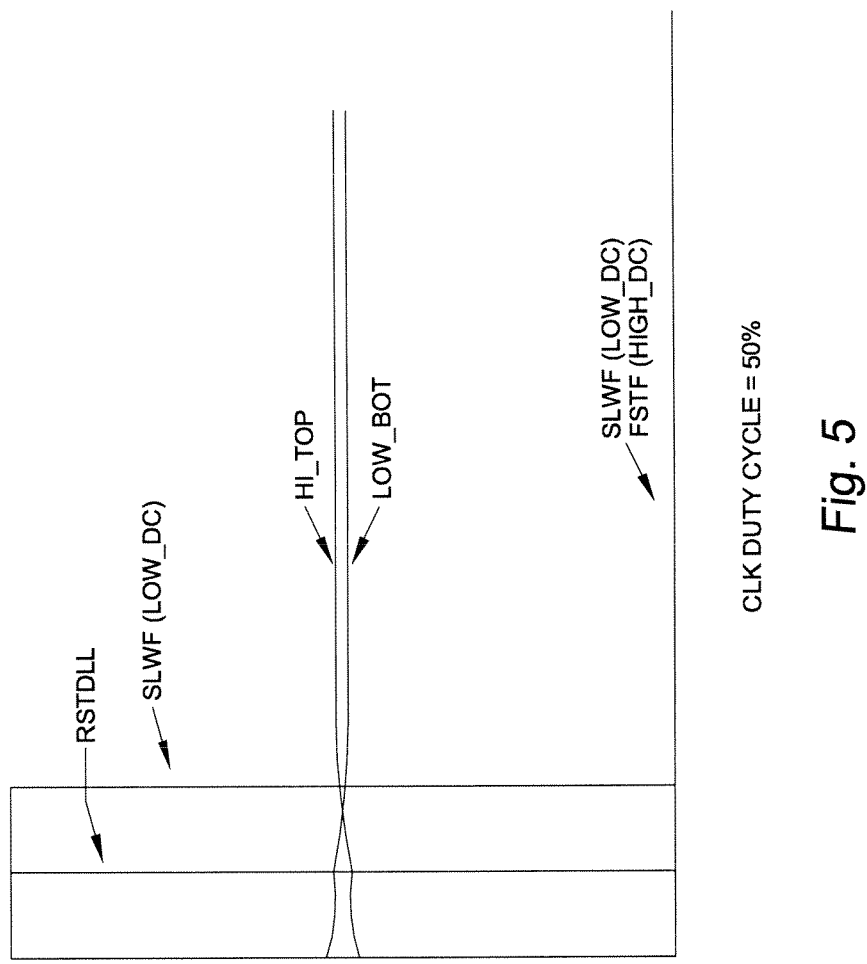

As noted above, FIGS. 4-5 are waveform diagrams associated with the duty cycle detector circuit of FIGS. 1A and 1B having an input clock signal with a 50% duty cycle. FIG. 4 shows the RSTDLL, SLWF (associated with the LOW_DC output node), FSTF (associated with the HIGH_DC output node), HI_TOP, and LO_BOT signals. Note that during an initial time period, the SLWF signal goes high, but thereafter the SLWF and FSTF signals are both at a logic zero state. Similarly, FIG. 5 shows the RSTDLL, SLWF (associated with the LOW_DC output node), FSTF (associated with the HIGH_DC output node), LO_TOP, and HI_BOT signals. Note that during an initial time period, the SLWF signal goes high, but thereafter the SLWF and FSTF signals are both at a logic zero state. When SLWF and FSTF are both low (in the dead band region) this occurs when the duty cycle is at or near 50% duty cycle. When both are low, no correction is made to the duty cycle with the DLL. Having the dead band results in corrections being made only when the sampled clock goes slightly above or slightly below 50% duty cycle. The deviation required before a high or low duty cycle correction is detected is determined by the dead band of the integrators. The outputs of the duty cycle detector, LOW_DC and HIGH_DC are only valid after the clock has been constantly running for a period of time long relative to the integration time constant of the integrator.

Figure 6:
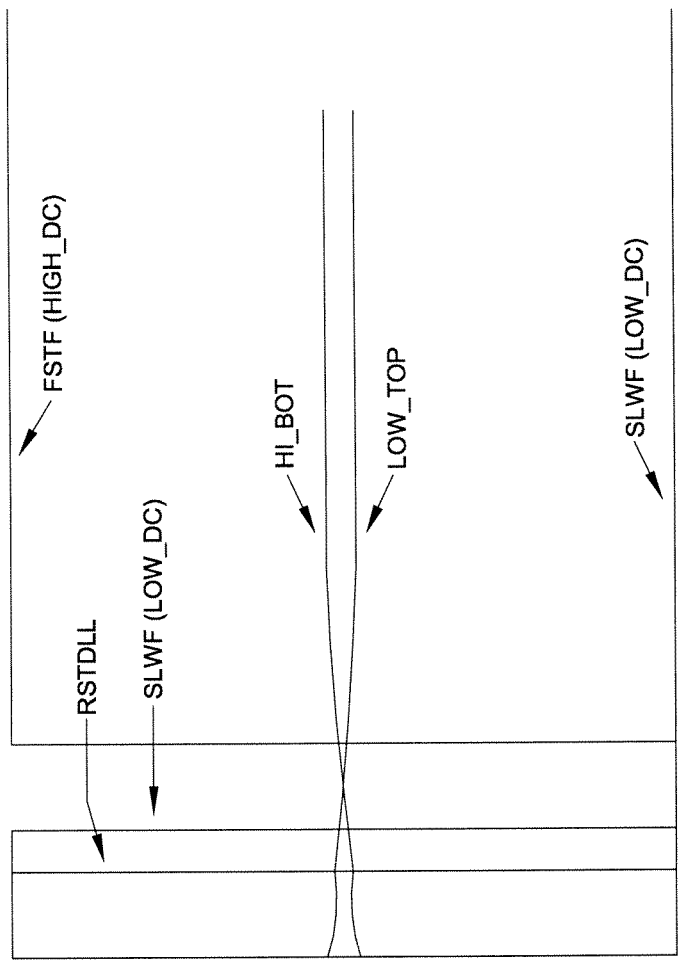
FIGS. 6-7 are waveform diagrams associated with the duty cycle detector circuit of FIGS. 1A and 1B having an input clock signal with a 53% duty cycle.
Figure 7:
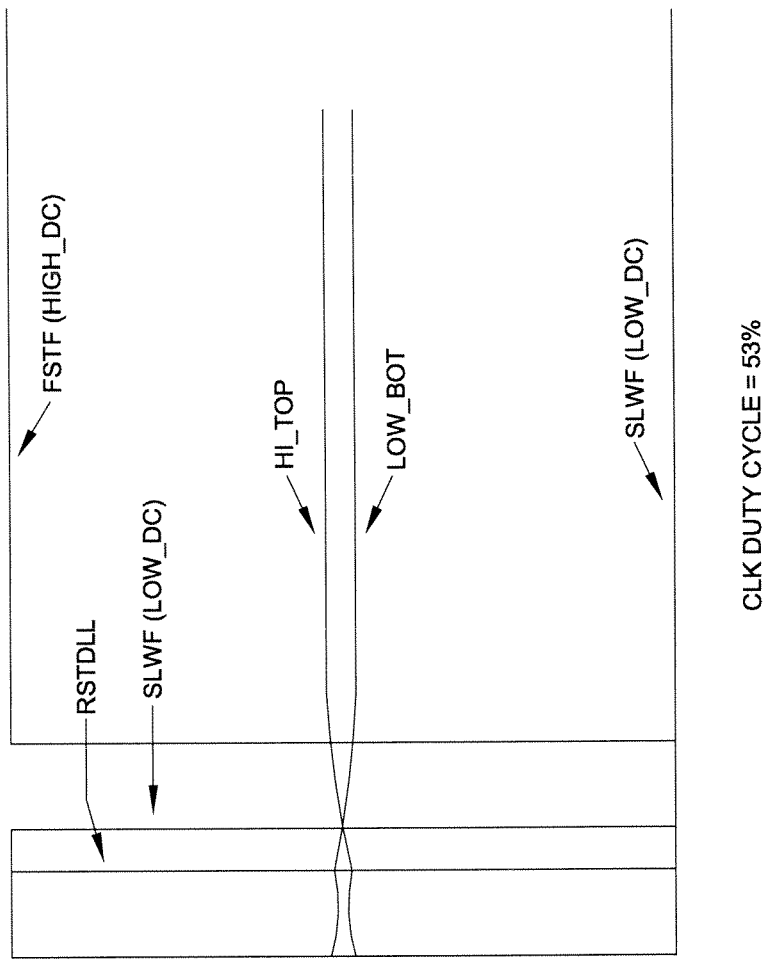

As noted above, FIGS. 6-7 are waveform diagrams associated with the duty cycle detector circuit of FIGS. 1A and 1B having an input clock signal with a 53% duty cycle. FIG. 6 shows the DLLRST, SLWF (associated with the LOW_DC output node), FSTF (associated with the HIGH_DC output node), HI_TOP, and LO_BOT signals. Note that during an initial time period, the SLWF signal goes high, then goes low, and thereafter the SLWF signal stays low and the FSTF signal switches to a logic one state. Similarly, FIG. 7 shows the RSTDLL, SLWF (associated with the LOW_DC output node), FSTF (associated with the HIGH_DC output node), LO_TOP, and HI_BOT signals. Note that during an initial time period, the SLWF signal goes high, then goes low, and thereafter the SLWF signal stays low and the FSTF signal switches to a logic one state.

Figure 8:
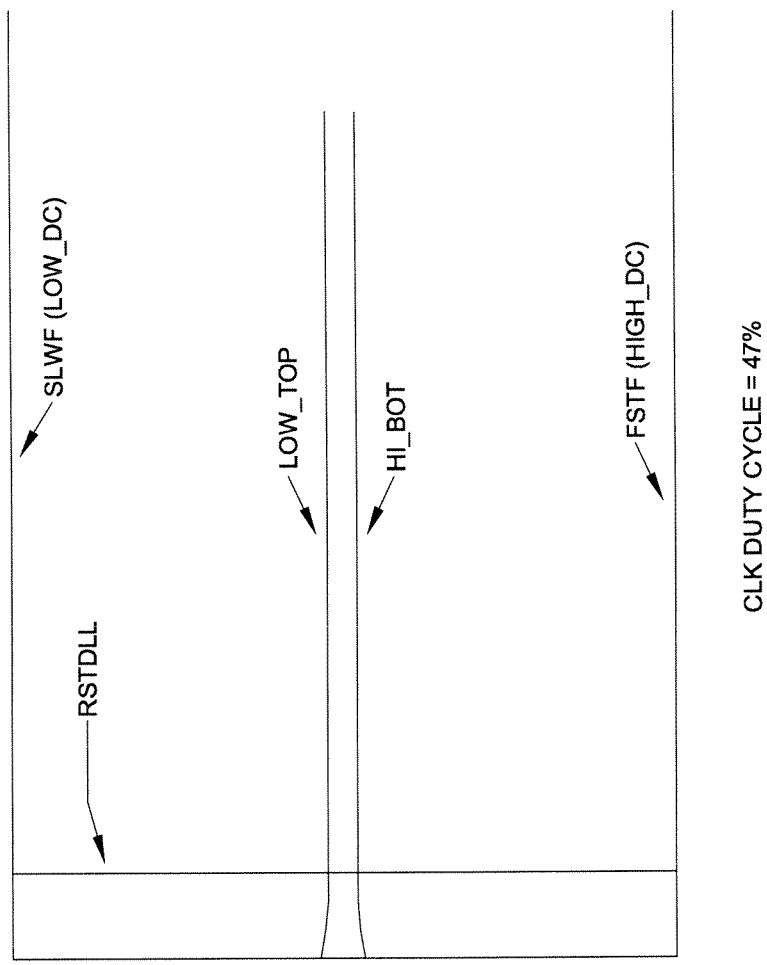
FIGS. 8-9 are waveform diagrams associated with the duty cycle detector circuit of FIGS. 1A and 1B having an input clock signal with a 47% duty cycle.
Figure 9:
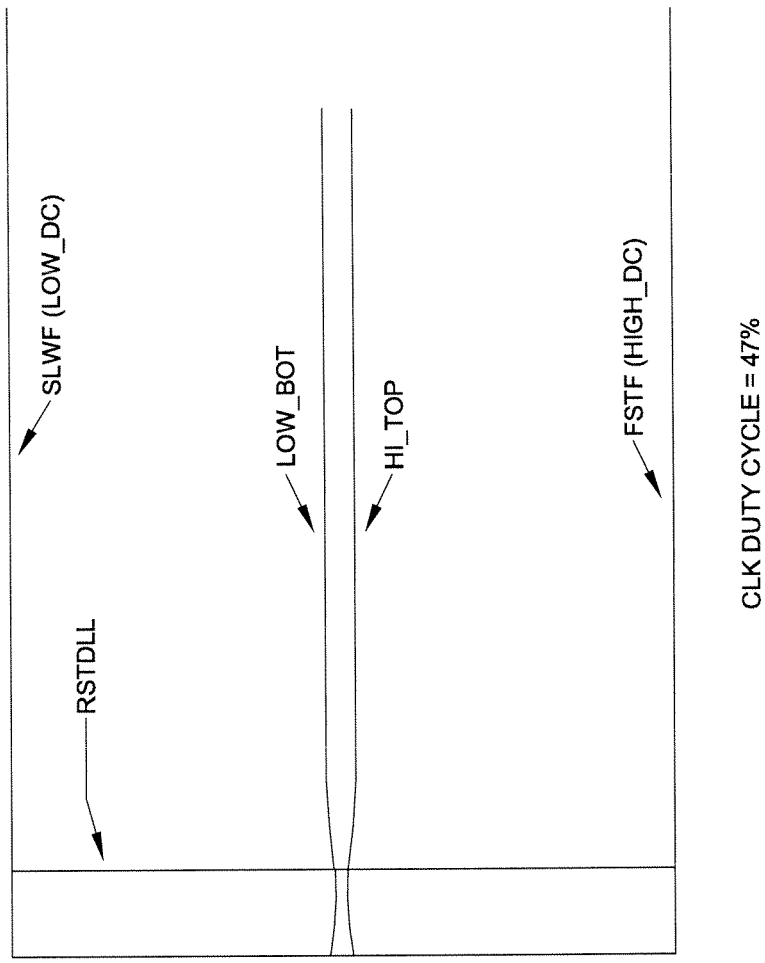

As noted above, FIGS. 8-9 are waveform diagrams associated with the duty cycle detector circuit of FIGS. 1A and 1B having an input clock signal with a 47% duty cycle. FIG. 8 shows the RSTDLL, SLWF (associated with the LOW_DC output node), FSTF (associated with the HIGH_DC output node), HI_TOP, and LO_BOT signals. Note the SLWF signal quickly switches to a logic one state, and the FSTF signal quickly switches to a logic zero state. The simulation in FIG. 8 starts with the clock running with a duty cycle of 47%. At the start of the simulation, a RST signal occurs to initialize the integration nodes to near mid-point. When the RST is released, the integrator immediately monitors the clock duty cycle. In the case of FIG. 8, the initialization set the integration levels very close to the integration level with the clock constantly running. Even though an almost immediate solution was found, the output of the duty cycle detector should not be used until sufficient sampling time has expired. In the present case, the DLL circuit holds off monitoring the duty cycle detector until the DLL has locked on the rising edge of the clock. FIGS. 6 and 7 illustrate this point where RST initializes the integrator to a predetermined voltage, determined by the reset circuits 106 and 108. In the present case, where there is a high duty cycle, the duty cycle detector does not settle on the correct solution immediately, but requires an integration period to determine the solution, as is shown in FIG. 6. Switching when the clock is first applied is not significant. Similarly, FIG. 9 shows the RSTDLL, SLWF (associated with the LOW_DC output node), FSTF (associated with the HIGH_DC output node), LO_TOP, and HI_BOT signals. Note the SLWF signal quickly switches to a logic one state, and the FSTF signal quickly switches to a logic zero state. No initial switching occurred because the reset state was the same as the integrated clock solution.

Figure 10:
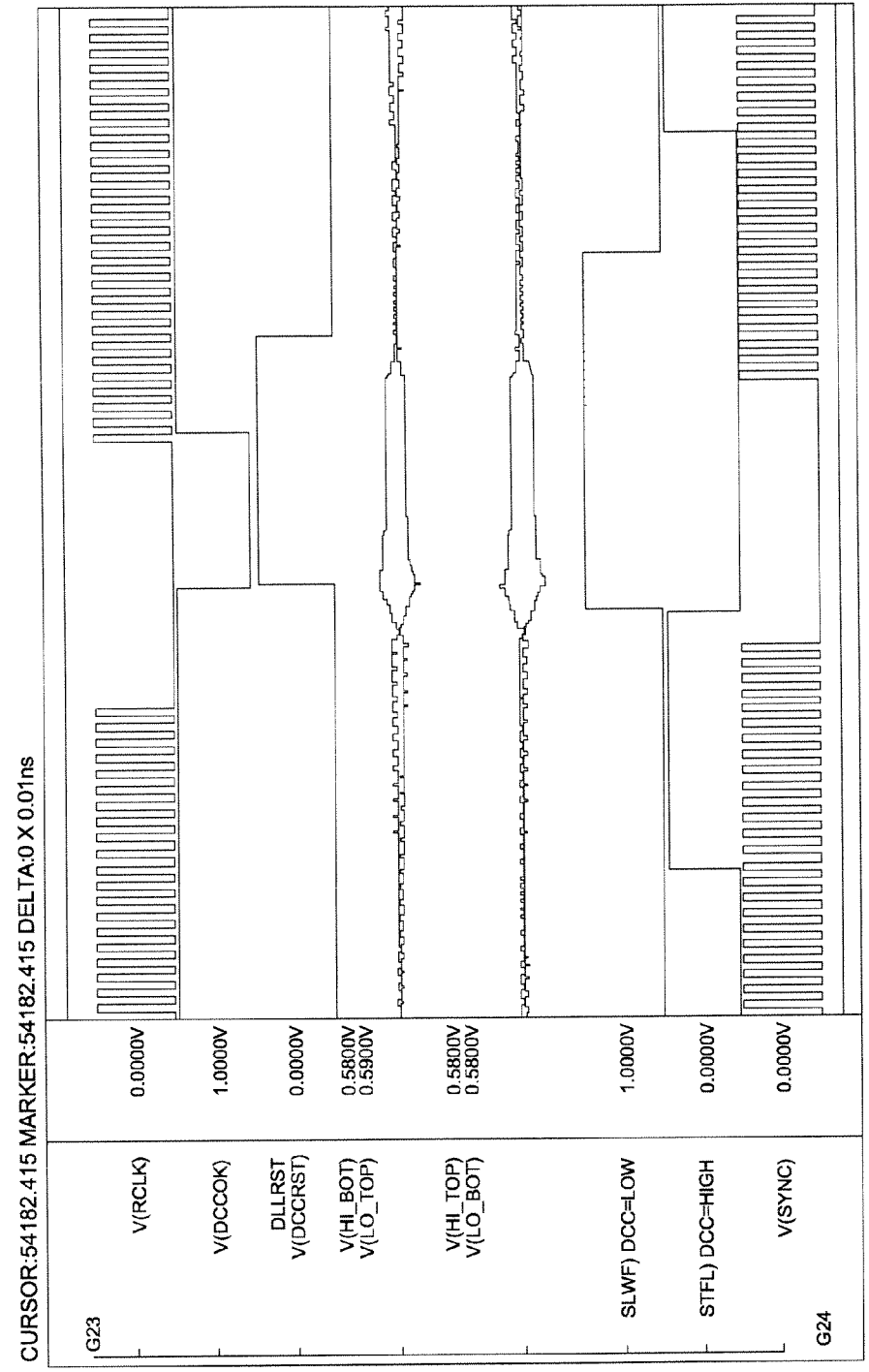
FIG. 10 is a waveform diagram associated with the duty cycle detector circuit of FIGS. 1A and 1B having an input clock signal with missing clock pulses.

As noted above, FIG. 10 is a waveform diagram associated with the duty cycle detector circuit of FIGS. 1A and 1B having an input clock signal with missing clock pulses. FIG. 10 includes the CLK, HI_BOT, LO_TOP, HI_TOP, LO_BOT, LOW_DC, and HI_DC signals. The plot of FIG. 10 is for the full DLL circuit to demonstrate how missing clocks are treated. When a missing clock is detected, by a circuit (not shown), a RST occurs to preset the integration nodes in preparation for when the clock restarts. The signals are DLL level signals. RCLK=CLK as previously mentioned, DCCOK is high when the clock is continuously running, and DCCOK is generated by a circuit in the DLL. When DCCOK goes low, RST (DCCRST) goes active. SYNC is "locked" and the duty cycle is corrected in the DLL circuit.

The method used in the present invention allows the ratio of the resistors in the pull-up and pull-down sections of each integrator to be different than one. This means that the voltages on the nodes connected to the comparators will be different for different resistor ratios. This is an important aspect of the present invention, since dual slope integrators that use a reference voltage require the ratio to match the reference voltage. In the present invention, the ratio can be changed, by the TMDCC programming or by changing the resistor ratio during design without specifically changing a separate reference voltage or voltages. This is true because the present invention does not have a conventional reference voltage. The reference voltage for the present invention is generated from the opposite integrator; the only requirement is that the two integrators have the same resistor ratio (or close to the same ratio). The resistor ratios of both integrators can be both changed to increase or decrease the voltages on the integrating nodes (at 50% DC) to the most favorable operating point of the comparators.

It will be apparent to those skilled in the art, therefore, that various modifications and variations can be made to the invention without departing from the spirit or scope of the invention. Thus, it is intended that the present invention covers the modifications and variations of this invention provided they come within the scope of the appended claims.

We claim:

1. A dual-complementary integrating duty cycle detector with dead band noise rejection comprising:
   a first integrator for receiving a first clock signal having first and second outputs;
   a second integrator for receiving a second clock signal having first and second outputs;
   a first comparator having a first input coupled to the first output of the second integrator, a second input coupled to the second output of the first integrator, and an output for providing a first correction signal; and
   a second comparator having a first input coupled to the first output of the first integrator, a second input coupled to the second output of the second integrator, and an output for providing a second correction signal,
   wherein the first and second comparators are configured to provide a dead band in the first and second correction signals wherein at least one of the first and second integrators comprises first, second, and third resistors in series.

2. The duty cycle detector of claim 1 wherein the first integrator comprises first, second, and third resistors in series.

3. The duty cycle detector of claim 2 further comprising a first capacitor coupled to a node at a junction of the first and second resistors.

4. The duty cycle detector of claim 3 further comprising a second capacitor coupled to a node at a junction of the second and third resistors.

5. The duty cycle detector of claim 2 further comprising a P-channel transistor configured for receiving the first clock signal coupled to the first resistor.

6. The duty cycle detector of claim 2 further comprising an N-channel transistor configured for receiving the first clock signal coupled to the third resistor.

7. The duty cycle detector of claim 2 further comprising an N-channel transistor configured for receiving the first clock signal coupled to a tap point of the third resistor.

8. The duty cycle detector of claim 1 further comprising a first reset circuit configured for receiving a reset signal and having an output coupled to the first input of the first comparator.

9. The duty cycle detector of claim 8 wherein the first reset circuit comprises first and second resistors coupled together to form the output thereof.

10. The duty cycle detector of claim 9 wherein the first reset circuit further comprises a P-channel transistor configured for receiving an inverted reset signal coupled to the first resistor.

11. The duty cycle detector of claim 9 wherein the first reset circuit further comprises an N-channel configured for receiving the reset signal coupled to the second resistor.

12. The duty cycle detector of claim 1 wherein the second integrator comprises first, second, and third resistors in series.

13. The duty cycle detector of claim 12 further comprising a first capacitor coupled to a node at a junction of the first and second resistors.

14. The duty cycle detector of claim 13 further comprising a second capacitor coupled to a node at a junction of the second and third resistors.

15. The duty cycle detector of claim 12 further comprising a P-channel transistor configured for receiving the second clock signal coupled to the first resistor.

16. The duty cycle detector of claim 12 further comprising an N-channel transistor configured for receiving the second clock signal coupled to the third resistor.

17. The duty cycle detector of claim 12 further comprising an N-channel transistor configured for receiving the second clock signal coupled to a tap point of the third resistor.

18. The duty cycle detector of claim 1 further comprising a second reset circuit configured for receiving a reset signal and having an output coupled to the first input of the second comparator.

19. The duty cycle detector of claim 18 wherein the second reset circuit comprises first and second resistors coupled together to form the output thereof.

20. The duty cycle detector of claim 19 wherein the second reset circuit further comprises a P-channel transistor configured for receiving an inverted reset signal coupled to the first resistor.

21. The duty cycle detector of claim 19 wherein the second reset circuit further comprises an N-channel configured for receiving the reset signal coupled to the second resistor.

22. A method for correcting the duty cycle of a clock signal, the method comprising:

integrating the clock signal to provide first and second signals;

integrating an inverted clock signal to provide third and fourth signals;

comparing the second and third signals to provide a first correction signal; and comparing the first and fourth signals to provide a second correction signal, wherein the first and second correction signals comprise a dead band, and wherein at least one of integrating the clock signal or integrating the inverted clock signal is accomplished using an integrator comprising first, second, and third resistors in series.

23. The method of claim 22 further comprising resetting the first, second, third, and fourth signals to respective midpoint values once a missing clock signal is detected.

24. The method of claim 23 further comprising releasing the first, second, third and fourth signals once a normal clock signal is detected.

\* \* \* \* \*